(12) United States Patent
Zhai et al.

(10) Patent No.: US 10,588,237 B2
(45) Date of Patent: Mar. 10, 2020

(54) ADAPTOR FOR STORAGE DEVICE

(71) Applicant: EMC IP Holding Company LLC, Hopkinton, MA (US)

(72) Inventors: Haifang Zhai, Shanghai (CN); David Dong, Shanghai (CN); Michael Hao Zhou, Shanghai (CN); Sandburg Hao, Shanghai (CN); Sean Xu Chen, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 1 day.

(21) Appl. No.: 15/954,656

(22) Filed: Apr. 17, 2018

(65) Prior Publication Data
US 2018/0303004 A1  Oct. 18, 2018

(30) Foreign Application Priority Data
Apr. 17, 2017  (CN) .......................... 2017 1 0250230

(51) Int. Cl.
| H05K 7/14 | (2006.01) |
| --- | --- |
| H01R 31/06 | (2006.01) |
| G06F 13/16 | (2006.01) |
| G06F 13/40 | (2006.01) |

(52) U.S. Cl.
CPC ....... *H05K 7/1487* (2013.01); *G06F 13/1668* (2013.01); *G06F 13/4068* (2013.01); *H01R 31/06* (2013.01); *H05K 7/1405* (2013.01); *H05K 7/1407* (2013.01); *H05K 7/1411* (2013.01); *G06F 2213/0026* (2013.01)

(58) Field of Classification Search
CPC ...... G06F 1/187; G06F 1/183; G06F 13/4068; G06F 1/185; G06F 2213/0026; G06F 13/1668; G06F 13/385; H05K 7/1487; H05K 7/1405; H05K 7/1407; H05K 7/1411; H01R 31/06
See application file for complete search history.

(56) References Cited

U.S. PATENT DOCUMENTS

| 9,311,176 | B1 | 4/2016 | Khokhar |  |
| --- | --- | --- | --- | --- |
| 2013/0135813 | A1* | 5/2013 | Jimenez, III | ............ G06F 1/185 |
|  |  |  |  | 361/679.32 |
| 2017/0220505 | A1* | 8/2017 | Breakstone | ......... G06F 13/4022 |
| 2018/0101500 | A1* | 4/2018 | Heyd | .................. G06F 13/4022 |

OTHER PUBLICATIONS

Chun Ma, et al.; "Method, Electronic Device and Computer Program Product for Evaluating Health of Storage Device," U.S. Appl. No. 16/367,368, filed Mar. 28, 2019.
Bing Liu, et al.; "Method and Apparatus for a Virtual Machine," U.S. Appl. No. 16/407,572, filed May 9, 2019.

(Continued)

*Primary Examiner* — James Wu
(74) *Attorney, Agent, or Firm* — BainwoodHuang

(57) ABSTRACT

Techniques involve use of an adaptor for a storage device. The adaptor includes a baseboard arranged to support an Open Compute Project (OCP) mezzanine card in the storage device; a connector coupled to the baseboard and arranged to connect with the storage device; and an adapting part coupled to the baseboard and including an insertion slot for receiving a first interface of the OCP mezzanine card.

16 Claims, 6 Drawing Sheets

(56) References Cited

OTHER PUBLICATIONS

Yan Zhao, et al.; "Open Compute Project Facebook Multi-Node Server Platform: Yosemite Design Specification," Version V0.5, http://opencompute.org, Feb. 8, 2016, pp. 1-58.
Yuval Bachar; "Open Compute Project Open19 System Level Specification," Version 1.0, http://opencompute.org, Mar. 11, 2019, pp. 1-66.
Steve Mills; "Open Compute Project Open Rack Standard," Version 2.1, http://opencompute.org, Jul. 15, 2016, pp. 1-72.
Harry Li, et al.; "Open Compute Project Mezzanine Card for Intel V2.0 Motherboard," http://opencompute.org, Oct. 8, 2012, pp. 1-8.

* cited by examiner

ADAPTOR FOR STORAGE DEVICE

RELATED APPLICATIONS

This application claim priority from Chinese Patent Application Number CN201710250230.7, filed on Apr. 17, 2017 at the State Intellectual Property Office, China, titled "AN ADAPTOR FOR STORAGE DEVICE" the contents of which is herein incorporated by reference in its entirety.

FIELD

Embodiments of the present disclosure generally relate to the storage field, and more specifically, to an adaptor for use in a storage device.

BACKGROUND

Open Compute Project (OCP) or Open Compute Program Mezzanine cards aim to provide industrial standard hardware to lower the costs, and they have specific profile dimension, functions, pins etc. As high-density input/output (I/O) cards, the OCP mezzanine cards have been extensively used by the server field. However, the racks of many storage devices still lack an interface of the OCP mezzanine card at the present, such that the OCP mezzanine card cannot be directly applied on the rack of these storage devices.

SUMMARY

Embodiments of the present disclosure provide an adaptor for use in a storage device.

In a first aspect, an adaptor for a storage device is provided. The adaptor comprises a baseboard arranged to support an Open Compute Project (OCP) mezzanine card in the storage device; a connector coupled to the baseboard and arranged to connect with the storage device; and an adapting part coupled to the baseboard and comprising an insertion slot for receiving a first interface of the OCP mezzanine card.

In some embodiments, the baseboard in the above adaptor comprises an opening formed in the middle of a side of the baseboard corresponding to the connector.

In some embodiments, the above adaptor further comprises a framework at least partially surrounding the baseboard.

In some embodiments, the framework in the above adaptor comprises a panel, the panel comprises a receiving part for receiving a second interface of the OCP mezzanine card.

In some embodiments, the above adaptor further comprises a latching part operated to lock the framework on the storage device or unlock the framework from the storage device.

In some embodiments, the connector and the first interface in the above adaptor follow the same peripheral component interconnect express (PCIe) protocol.

In some embodiments, the connector in the above adaptor is disposed at a first side of the baseboard and extends outward from the first side, the first side being parallel to the panel; and the adapting part is disposed at a second side of the baseboard perpendicular to the first side.

In some embodiments, the OCP mezzanine card in the above adaptor is detachably coupled to the baseboard via a clip.

In second aspect, an input/output (I/O) card is provided. The I/O card comprises an Open Compute Project (OCP) mezzanine card; and the adaptor (100) as mentioned above.

In third aspect, a method for manufacturing the adaptor as mentioned above is provided.

Through the following description of the example embodiments with reference to the drawings, the features of the present disclosure will be more apparent.

It is to be understood that the Summary does not aim to identify key or vital features of the embodiments of the present disclosure, or limit the scope of the present disclosure. Other features of the present disclosure will be easier to understand through the description below.

BRIEF DESCRIPTION OF THE DRAWINGS

Through the following detailed description with reference to the accompanying drawings, the above and other objectives, features, and advantages of embodiments of the present disclosure will become more apparent. In the drawings, a plurality of embodiments of the present disclosure will be explained by examples and non-restrictive manner, wherein.

DETAILED DESCRIPTION OF EMBODIMENTS

Figure 1:
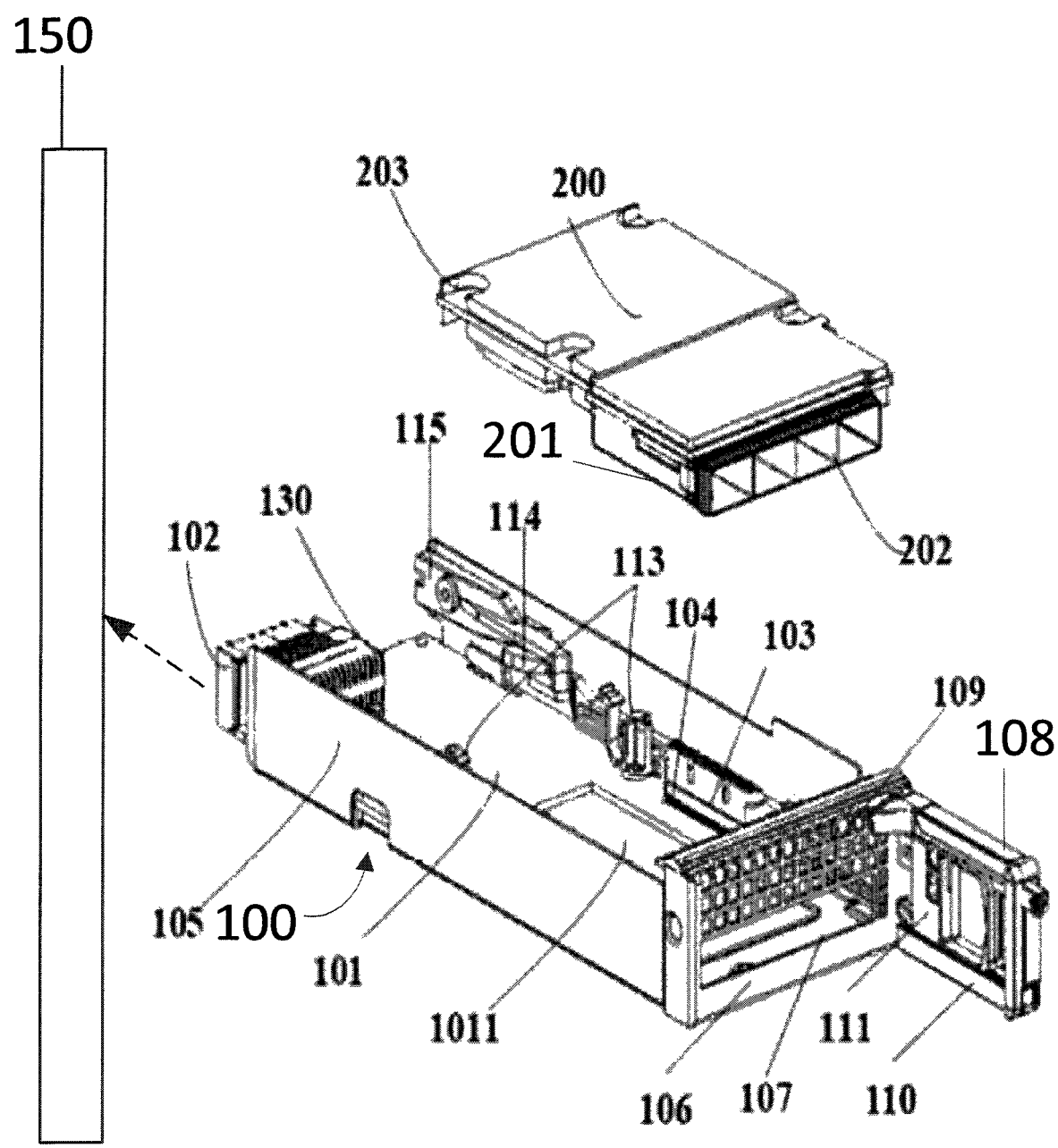
FIG. 1 illustrates a perspective view of an adaptor for a storage device and an OCP mezzanine card (not mounted together) according to example embodiments of the present disclosure.

Principles of the present disclosure will now be described with reference to various example embodiments illustrated in the drawings. It is to be understood that description of those embodiments is merely to enable those skilled in the art to better understand and further implement example embodiments disclosed herein and is not intended for limiting the scope disclosed herein in any manner. It should be noted that similar or same reference signs can be used in the drawings under feasible cases, and similar or same reference signs can represent similar or same functions. Those skilled in the art can easily recognize that alternative embodiments of the structure and method described in the text can be employed from the following description without deviating from the principles of the present disclosure depicted in the text.

As used herein, the term "comprises" and its variants are to be read as open-ended terms that mean "comprises, but is not limited to." The term "based on" is to be read as "based at least in part on." The term "one embodiment" is to be read as "at least one embodiment." The term "a further embodiment" is to be read as "at least one further embodiment."

OCP mezzanine cards, as high-density Input/Output (I/O) cards, have been used more and more extensively in the server field so far, and their functions are getting versatile. However, racks of many storage devices do not support the OCP mezzanine cards. Therefore, during the design of the I/O card for these storage devices, it needs to devise the I/O card comprehensively to implement various functions, which will correspondingly increase time costs and economic costs.

Embodiments of the present disclosure provide an adaptor for a storage device, which can adapt the OCP mezzanine card to form a new I/O card applied into some storage devices (for example, dedicated or specific storage devices) that cannot directly use the OCP mezzanine cards.

Figure 2:
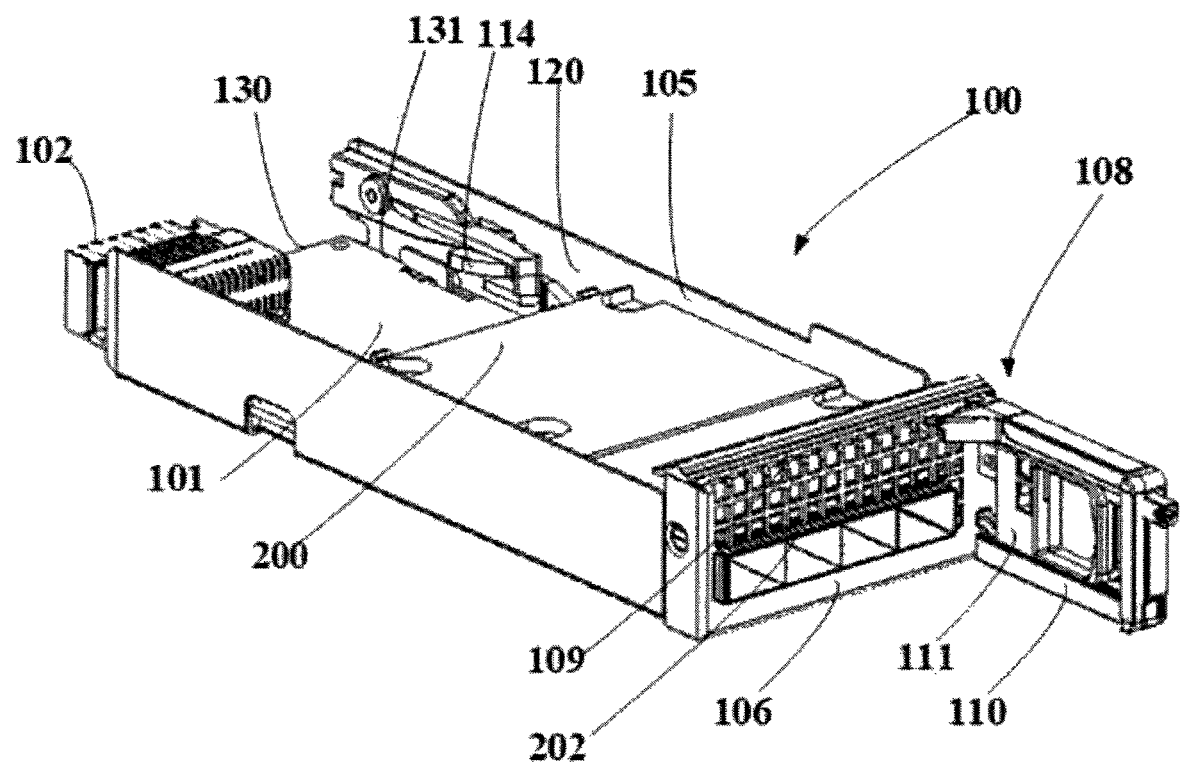
FIG. 2 illustrates a perspective view of an adaptor for a storage device and an OCP mezzanine card (mounted together) according to example embodiments of the present disclosure.
Figure 3:
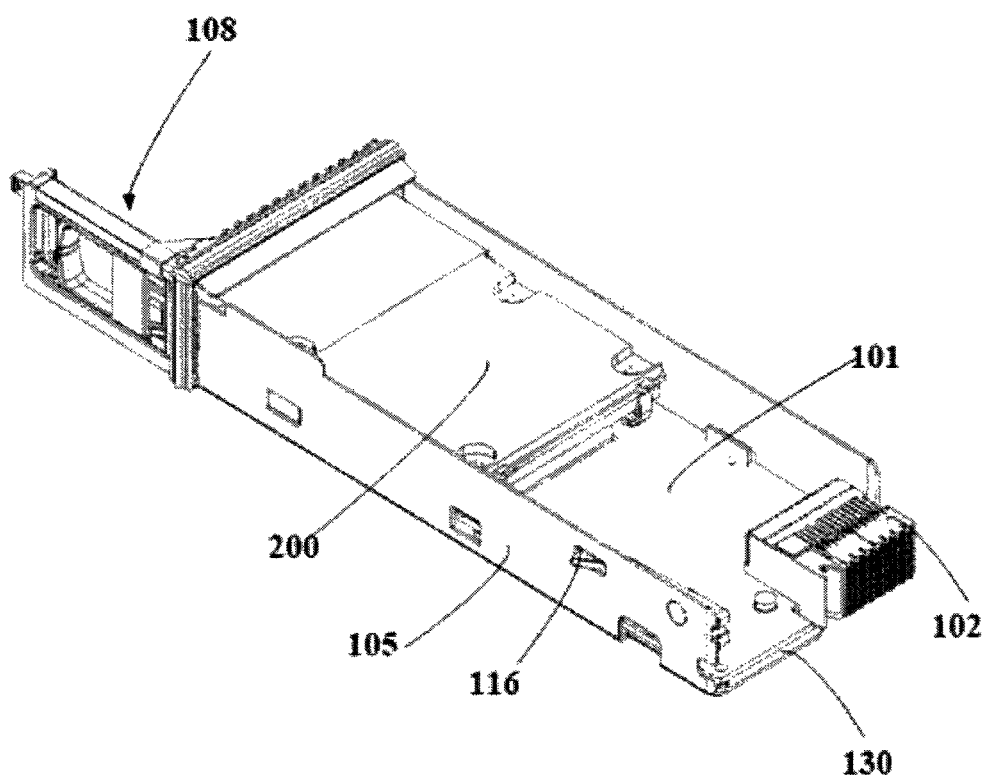
FIG. 3 illustrates a perspective view of an adaptor for a storage device and an OCP mezzanine card (mounted together) according to example embodiments of the present disclosure from another perspective.
Figure 4:
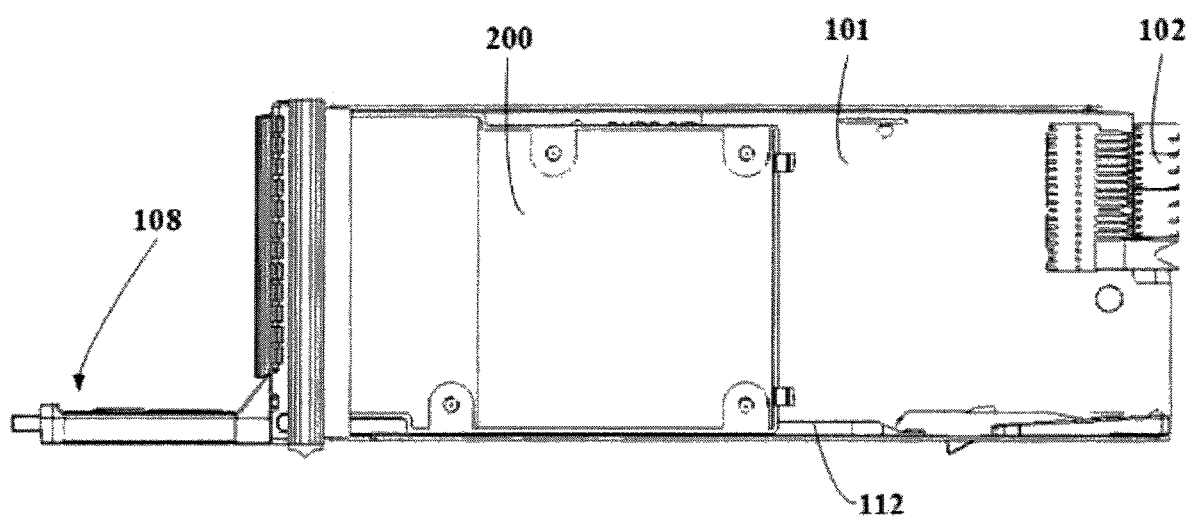
FIG. 4 illustrates a top view of an adaptor for a storage device and an OCP mezzanine card (mounted together) according to example embodiments of the present disclosure.
Figure 5:
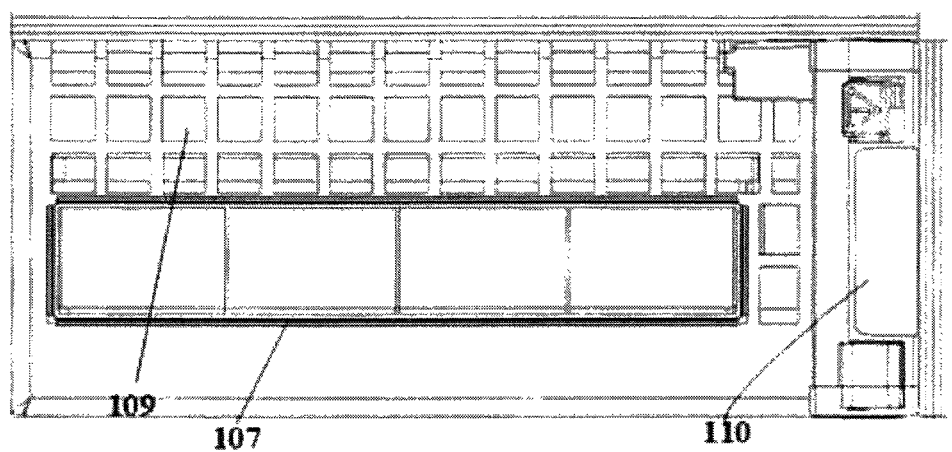
FIG. 5 illustrates a side view of an adaptor for a storage device and an OCP mezzanine card (mounted together) according to example embodiments of the present disclosure.
Figure 6:
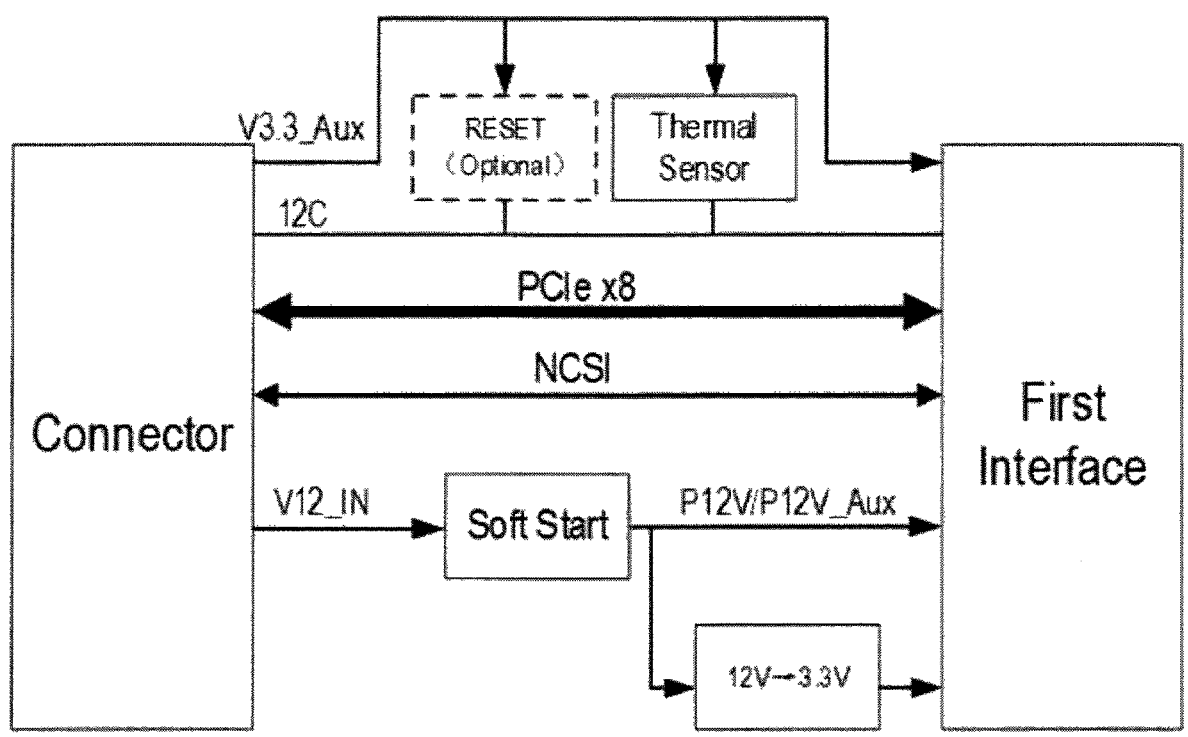
FIG. 6 illustrates a schematic diagram of circuit on the baseboard for implementing contents of the present disclosure.

An adaptor structure of the example embodiments of the present disclosure will be described in details with reference to FIGS. 1 to 6. FIG. 1 illustrates a perspective view of an adaptor for a storage device and an OCP mezzanine card (not mounted together) according to example embodiments of the present disclosure; FIG. 2 illustrates a perspective view of an adaptor for a storage device and an OCP mezzanine card (mounted together) according to example embodiments of the present disclosure; FIG. 3 illustrates a perspective view of an adaptor for a storage device and an OCP mezzanine card (mounted together) according to example embodiments of the present disclosure from another perspective; FIG. 4 illustrates a plan view of an adaptor for a storage device and an OCP mezzanine card (mounted together) according to example embodiments of the present disclosure; FIG. 5 illustrates a side view of an adaptor for a storage device and an OCP mezzanine card (mounted together) according to example embodiments of the present disclosure; and FIG. 6 illustrates a schematic diagram of main wiring of a baseboard of the adaptor for the storage device.

As shown in FIG. 1, the adaptor for the storage device described here generally comprises a baseboard 101, a connector 102, and an adapting part 103. The baseboard 101 may support an OCP mezzanine card 200 in the storage device, wherein the storage device here may be a rack, a rack frame or server and the like. The baseboard 101 comprises a circuit for electrically connecting the connector 102 and the adapting part 103. The connector 102 is connected to a corresponding position of the baseboard 101 and may be connected with the storage device 150. The adapting part 103 is connected to a further corresponding position of the baseboard 101 and has an insertion slot 104 into which an interface 201 (hereinafter referred to as "first interface 201") of the OCP mezzanine card can be inserted.

In this way, additional functions, such as an independent board card power switch and monitoring heat dissipation situation of the I/O card etc., may be integrated on the adaptor 100 as needed while the functions of the OCP mezzanine card are sufficiently provided. Besides, such design implements flexible configuration of the I/O card and greatly reduces Time To Market of the new product. Furthermore, it also correspondingly lowers related manufacture and research costs.

In some embodiments, the circuit on the baseboard 101 may be provided in the form of a circuit board. Besides, the circuit board can be mounted on the baseboard 101, or integrated on the baseboard 101. In case that the circuit board is integrated on the baseboard 101, the circuit board may be a part of the baseboard 101 only, or the entire baseboard 101. In some embodiments, in the schematic electrical connection graph shown in FIG. 6, the circuit may comprise a thermal sensor for monitoring heat dissipation situation of the I/O card and/or control module. In some embodiments, the circuit board may also be integrated as a resetting module implemented by the Electrically Erasable Programmable Read-Only Memory (EEPROM). In some embodiments, the circuit board may also be implemented as some user-defined functions described above and advanced features, such as hot plug.

In some embodiments, the connector 102 has a plug (not shown), which may be mounted in an electrically conductive through-hole preserved on the baseboard 101. The mounting method may adopt the common conductive manner of connecting two parts in the art, such as tin soldering or the like. Of course, in some embodiments, the electrical connection method between the connector 102 and the baseboard 101 may also employ other electrical connection manners in the art. In some embodiments, the connector 102 has a profile that may be inserted in the storage device. For example, the connector 102 has a profile similar to "cube" as shown in FIG. 1 and may be used for a connecting part (also known as SLIC interface) for miniature I/O card. The connector 102 serving as the SLIC interface has a small dimension, so a high density of such SLIC interface may be arranged within the limited space of the board card to realize desired data transmission volume. It is to be understood that the SLIC interface is only exemplary and the present disclosure does not intend to limit a specific profile of the connector 102. Instead, a corresponding connector 102 may be selected according to the storage apparatus. In some embodiments, the adapting part 103 has a flat or elongated profile as shown in FIG. 1, to receive a first interface 201 of the OPC mezzanine card. The adapting part 103 may be connected to the baseboard 101 by the connection method identical to the connector 102.

In some embodiments, according to FIG. 1, the baseboard 101 has an opening 1011 formed at a middle position of one side of the baseboard 101 corresponding to the adapting part 103. The opening 1011 is such configured that a main heating part of the OCP mezzanine card 200 may be positioned at the opening 1011 when the OCP mezzanine card 200 is inserted to the adaptor 100. Therefore, the arrangement of the opening 1011 may facilitate heat dissipation of the OCP mezzanine card 200. Meanwhile, it may also lower material costs of the baseboard 101 and the overall weight of the adaptor. In the embodiment as shown in FIG. 1, the opening 1011 is rectangular, and it is to be understood that the opening 1011 may adopt any other suitable shapes, for example circular, oval, polygonal or irregular or the like. Moreover, the dimension of the opening 1011 may be adjusted as needed.

In some embodiments, as shown in FIGS. 1-3, the adaptor 100 also comprises a framework 105, which may at least partially surround the baseboard 101. In the implementation shown by FIG. 1, the framework 105 partially surrounds the baseboard 101 on three sides. The baseboard 101 is mounted on the framework, and the mounting method may adopt the common connection method in the art, such as screw fastening, gluing, riveting etc. The side of the baseboard 101 on which the connector 102 is positioned is not surrounded, such that the connector 102 may be inserted in the storage device. Such an arrangement may also facilitate heat dissipation.

In some embodiments, as shown in FIGS. 1-3, the framework 105 may comprise a panel 106 positioned at a side opposite to the connector 102. The panel 106 also comprises a receiving part 107 to receive a second interface 202, which usually is an interface for receiving an external device. When the adaptor 100 is inserted in the storage device, the panel 106 normally faces towards outside. Therefore, the second interface 202 also faces outside to facilitate inserting the interface of the external device in the second interface 202. The receiving part 107 is provided at a corresponding position according to the position of the second interface 202. In the embodiment shown by FIG. 2, the receiving part 107 is disposed at a lower part of a side of the panel 106 adjacent to the baseboard with a width substantially equal to half the height of the panel, and basically has a rectangular shape. An upper part of the receiving part 107 on the panel 106 has heat vents 109, which allow cold air outside the adaptor 100 to enter the adaptor 100 for radiating heat from the OCP mezzanine card 200 and the baseboard 101. In the embodiment of FIG. 1, the heat vents 109 comprise a plurality of square openings. It is to be understood that the heat vents 109 may also employ any other ventilation structures, such as grid or a plurality of holes in other shapes etc.

In some embodiments, as shown in FIGS. 1 and 2, the panel 106 may be secured on the framework 105 via fasteners, so as to facilitate maintenance or replacement of the panel 106 and the framework 105. The pane 106 and the framework 105 may adopt different materials. For example, in some embodiments, the panel 106 may be made of metal materials, such as aluminum alloy, stainless steel or the like, and the material for manufacturing the framework 105 may be the same or different. In some embodiments, the framework 105 and the panel 106 may be integrally formed or separately manufactured, and then connected with one another by rivets.

In some embodiments, as shown in FIGS. 1 and 2, the adaptor 100 may comprise a latching part 108, which may lock the framework 105 on the storage device or unlock it from the storage device. In the embodiments as shown in FIGS. 1 and 2, the latching part 108 comprises a handle 110, a slider 111 and a draw bar 112. The slider 111 and the draw bar 112 may be an integral structure or the draw bar 112 is permanently connected on the slider 111. The draw bar 112 extends from the panel 106 to the interior of the framework 105 and has a wedge structure 114 at an extremity of the interior of the framework 105. The wedge structure 114 is fitted with a locking part 115 on a side wall of the framework 105. In response to user's operation, the slider 111 may move in the handle 110, to drive the draw bar 112 and the wedge structure 114 to move in a direction perpendicular to the panel 105. During the movement, a slope of the wedge structure 114 may drive a stopper 116 on the locking part 115 to switch between a locking position and an unlocking position, as shown in FIG. 3. Therefore, when the user pulls the slider 111 outward, the wedge structure 114 may cause the stopper 116 to switch to the unlocking position, so that the framework 105 is allowed to be removed from the storage device. In some embodiments, the latching part 108 also comprises a restoring unit (not shown). When the user stops pulling the slider 111, the restoring unit may cause the slider to slide to the initial position, so as to switch the stopper 116 to the locking position, thereby preventing accidental removal of the framework 105 from the storage device. In some embodiments, the latching structure 108 also comprises an intermediate position. When the user stops pulling the slider 111, the slider will stop at the intermediate position with the restoring unit. At the intermediate position, the stopper 116 is in an unlocking state, such that the user may further operate the unlocked framework 105 and adaptor 100. It is to be understood that the latching part 108 may also adopt other structures in some embodiments, to implement locking the framework 105 on the storage device or unlocking it from the storage device.

In some embodiments, according to FIG. 6, the connector 102 and the first interface 201 may follow the same peripheral component interconnect express (PCIe) protocol. As the PCIe bus has a higher data transmission rate and scalability, the storage device based on the PCIe protocol will become more and more common. It is to be understood that the PCIe protocol here is merely for illustration, without suggesting any limitations as to the scope of the present disclosure. Any other suitable protocols are possible as well. For example, SAS, interface bus (IB) and the like.

In some embodiments, as shown in FIGS. 1-3, the connector 102 is disposed at a first side 130 of the baseboard 101 not surrounded by the framework 105, i.e., the first side 130 parallel to and opposite to the panel 106, and protrudes outward from the first side 103 to facilitate inserting of the connector 102 of the adaptor 100 in the corresponding interface of the storage device. The adapting part 103 that is required to be connected with the first interface 201 of the OCP mezzanine card is disposed at a second side 131 perpendicular to the first side 130, wherein the second side 131 is adjacent to a side wall of the framework 105 where the locking part 115 is positioned and the second side is perpendicular to the panel 106.

In some embodiments, as shown in FIG. 1, the baseboard 101 may be provided with a clip 113 thereon and the OCP mezzanine card is detachably connected on the baseboard 101 via the clip 113. The clip 113 is disposed in the middle of the baseboard 101 and clamps a side of the OCP adaptor 200 opposite to the second interface 202. A positioning pin (not shown) may also be provided at one side of the baseboard 101 adjacent to the panel 106 for positioning the OCP mezzanine card 200. In some embodiments, the clip 113 may be detachably connected on the baseboard 1. In some embodiments, the adaptor 100 also comprises a mounting hole (not shown) on the baseboard 101. Besides, a bolt hole 203 is also provided at a corresponding position of the OCP mezzanine card 200 for the bolt to pass. The OCP mezzanine card is secured on the adaptor 100 by coupling the bolt to the mounting hole 113. It is to be understood the above embodiment of coupling the OCP mezzanine card 200 to the adaptor 100 detachably is merely for illustration, without suggesting any limitations as to the scope of the present disclosure. Any other suitable methods and/or arrangements are possible as well. For example pin-hole connection or frictional connection in some embodiments.

Although some specific embodiments of the present disclosure have been exhibited in details by examples, those skilled in the art should understand that the above examples are only exemplary and are not intended for restricting the scope of the present disclosure. Those skilled in the art should understand that the above embodiments may be modified without deviating from the scope and spirits of the present disclosure. The scope of the present disclosure is defined by the attached claims.

In the description and the following claims, the terms "comprise" and "comprise" are to be read as comprising the explained component or component group without excluding any other components or component groups unless indicated otherwise in the context.

The citation of any prior art in the description is not and should not be deemed as acknowledging or suggesting that the prior art constitutes the common knowledge.

It should be appreciated that the claims below are only temporary claims and may be the examples of the possible claims, and are not intended for restricting any future patent applications based on the present application by the scope of the claims. The example claims may be added or deleted in the future to further define or re-define the present disclosure.

We claim:

1. An adaptor for a storage device, comprising:
   a baseboard arranged to support an Open Compute Project (OCP) mezzanine card in the storage device;
   a connector coupled to the baseboard and arranged to connect with the storage device; and
   an adapting part coupled to the baseboard and comprising an insertion slot for receiving a first interface of the OCP mezzanine card,
   wherein the baseboard is constructed and arranged to include an opening formed at a middle position of one side of the baseboard corresponding to the adapting part, the opening being constructed and arranged to enable positioning of a main heating part of the OCP mezzanine card at the opening when the OCP mezzanine card is inserted into the adaptor.

2. The adaptor of claim 1, further comprising: a framework at least partially surrounding the baseboard.

3. The adaptor of claim 2, wherein the framework comprises a panel, the panel comprising a receiving part for receiving a second interface of the OCP mezzanine card.

4. The adaptor of claim 3, further comprising:
   a latching part operable to lock the framework on the storage device or unlock the framework from the storage device.

5. The adaptor of claim 3, wherein the connector is disposed at another side of the baseboard and extends outward from the other side of the baseboard, the other side being parallel to the panel; and the adapting part is disposed at the one side of the baseboard perpendicular to the other side.

6. The adaptor of claim 1, wherein the connector and the first interface follow a same peripheral component interconnect express (PCIe) protocol.

7. The adaptor of claim 1, wherein the OCP mezzanine card is detachably coupled to the baseboard via a clip.

8. The adaptor of claim 1, wherein the OCP mezzanine card is removably attached to the adaptor via the insertion slot.

9. The adaptor of claim 1, wherein the adapting part is constructed and arranged to enable hot-swapping of the OCP mezzanine card with the adaptor via the insertion slot.

10. An Input/Output (I/O) card, comprising:
    an Open Compute Project (OCP) mezzanine card; and
    an adaptor, wherein the adaptor comprises:
      a baseboard arranged to support the Open Compute Project (OCP) mezzanine card in a storage device;
      a connector coupled to the baseboard and arranged to connect with the storage device; and
      an adapting part coupled to the baseboard and comprising an insertion slot for receiving a first interface of the OCP mezzanine card,
      wherein the baseboard is constructed and arranged to include an opening formed at a middle position of one side of the baseboard corresponding to the adapting part, the opening being constructed and arranged to enable positioning of a main heating part of the OCP mezzanine card at the opening when the OCP mezzanine card is inserted into the adaptor.

11. The Input/Output card of claim 10, wherein the adaptor further comprises:
    a framework at least partially surrounding the baseboard.

12. The Input/Output card of claim 11, wherein the framework comprises a panel, the panel comprising a receiving part for receiving a second interface of the OCP mezzanine card.

13. The Input/Output card of claim 12, wherein the adaptor further comprises:
    a latching part operable to lock the framework on the storage device or unlock the framework from the storage device.

14. The Input/Output card of claim 12, wherein the connector is disposed at another side of the baseboard and extends outward from the other side of the baseboard, the other side being parallel to the panel; and the adapting part is disposed at the one side of the baseboard perpendicular to the other side.

15. The Input/Output card of claim 9, wherein the connector and the first interface follow a same peripheral component interconnect express (PCIe) protocol.

16. A method for manufacturing an adaptor, wherein the adaptor comprises:
    a baseboard arranged to support an Open Compute Project (OCP) mezzanine card in a storage device;
    a connector coupled to the baseboard and arranged to connect with the storage device; and
    an adapting part coupled to the baseboard and comprising an insertion slot for receiving a first interface of the OCP mezzanine card,
    wherein the baseboard is constructed and arranged to include an opening formed at a middle position of one side of the baseboard corresponding to the adapting part, the opening being constructed and arranged to enable positioning of a main heating part of the OCP mezzanine card at the opening when the OCP mezzanine card is inserted into the adaptor.

* * * * *